United States Patent [19]

Drake et al.

[11] Patent Number: 4,961,821
[45] Date of Patent: Oct. 9, 1990

[54] ODE THROUGH HOLES AND BUTT EDGES WITHOUT EDGE DICING

[75] Inventors: Donald J. Drake, Rochester; William G. Hawkins; Michael R. Campanelli, both of Webster; Thomas A. Tellier, Williamson, all of N.Y.

[73] Assignee: Xerox Corporation, Rochester, N.Y.

[21] Appl. No.: 440,296

[22] Filed: Nov. 22, 1989

[51] Int. Cl.⁵ .................. H01L 21/306; B44C 1/22; C03C 15/00; C03C 25/06
[52] U.S. Cl. ...................... 156/647; 156/644; 156/651; 156/657; 156/661.1; 156/662; 346/140 R; 437/226
[58] Field of Search ............. 156/643, 644, 647, 633, 156/648, 651, 653, 657, 659.1, 661.1, 662; 346/1.1, 140 R; 437/226, 228, 241

[56] References Cited

U.S. PATENT DOCUMENTS

| | | | |
|---|---|---|---|
| 4,169,008 | 9/1979 | Kurth | 156/600 |
| 4,601,777 | 7/1986 | Hawkins et al. | 156/626 |
| 4,612,554 | 9/1986 | Poleshuk | 346/140 R |
| 4,774,530 | 9/1988 | Hawkins | 346/140 R |
| 4,784,721 | 11/1988 | Holmen et al. | 156/647 |
| 4,789,425 | 12/1988 | Drake et al. | 156/644 |
| 4,822,755 | 4/1989 | Hawkins et al. | 437/227 |
| 4,863,560 | 9/1989 | Hawkins | 156/644 |
| 4,875,968 | 10/1989 | O'Neil | 156/633 |

*Primary Examiner*—William A. Powell
*Attorney, Agent, or Firm*—Oliff & Berridge

[57] ABSTRACT

At least one through opening of predetermined location and dimensions is fabricated in a (100) silicon wafer by orientation dependent etching method after completion of integrated circuits on the wafer, the opening extending through the wafer between a circuit surface of the wafer and an opposite parallel base surface of the wafer and having a predetermined location relative to the integrated circuit on the circuit surface of the wafer. The method includes the steps of fabricating the integrated circuit on the circuit surface of the wafer; applying an etch resistant layer of plasma silicon nitride on the circuit and base surfaces of the wafer; patterning the etch resistant plasma silicon nitride layer on the circuit surface to define an upper etch opening having a location and dimensions which define the predetermined location and dimensions of the through opening; and patterning the plasma silicon nitride layer on the base surface to produce a lower etch opening aligned with the upper etch opening within a predetermined tolerance. The wafer is then anisotropically etched to produce a first recess corresponding to the upper etch opening in the circuit surface and a second recess corresponding to the lower etch opening in the base surface, each of the first and second recesses being bounded by (111) plane side walls. The anisotropic etching of the second recess intersects the first recess to form the through opening bounded by (111) plane side walls and has its predetermined dimensions and location defined by the patterning of the upper etch opening.

33 Claims, 10 Drawing Sheets

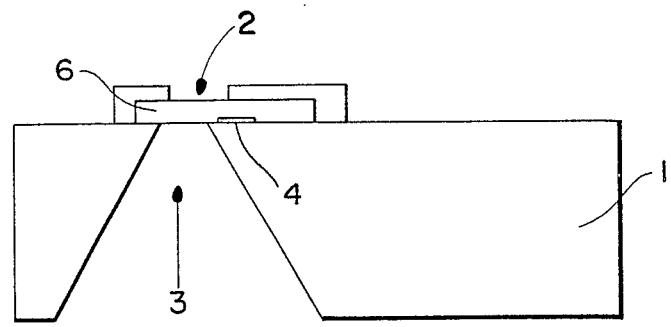
Fig_ 2
PRIOR ART
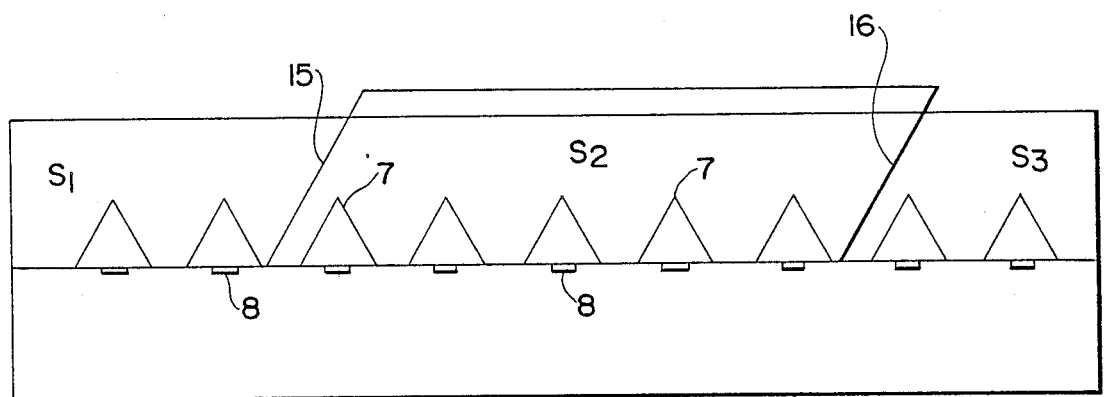
Fig_ 3
PRIOR ART
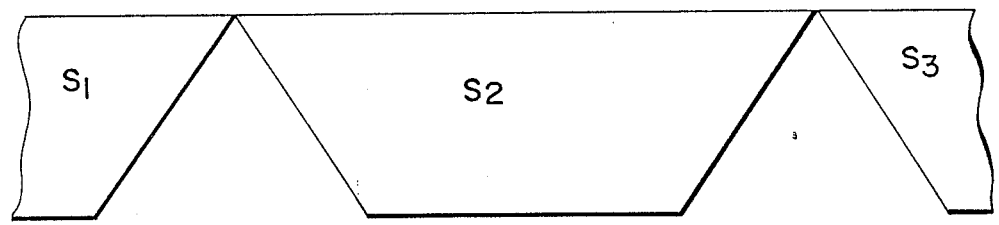
Fig_ 4
PRIOR ART

ODE THROUGH HOLES AND BUTT EDGES WITHOUT EDGE DICING

BACKGROUND OF THE INVENTION

1. Field of the Invention

This invention relates to methods of precisely forming through holes in (100) silicon wafers by orientation dependent etching (ODE) either before or after fabrication of the integrated circuit on the wafer. More specifically, the invention involves ODE to fabricate integrated circuit (IC) wafer subunits having precision through holes which define butt edges or surfaces for forming a butted array of subunits. The ability to precisely locate and dimension butt edges or surfaces of IC wafer subunits (or chips) finds use in the precision delineation of these wafer subunits for any extended array using subunit modules. Wafer subunits are aligned in extended arrays to form, e.g., pagewidth printheads for inkjet type printers, or RIS and ROS arrays.

2. Description of Related Art

Previous attempts at placing through holes in silicon wafers after integrated circuit fabrication have encountered many problems. Since virtually all integrated circuit fabrication is done in (100) silicon wafers, the most precise fabrication process involves etching (111) plane troughs or recesses into a surface of the wafer. However, it was impossible to apply the standard etch resistant masking layer of pyrolytic silicon nitride over the integrated circuitry due to the high temperature (greater than 800° C.) process for that film, which would cause silicon-aluminum interdiffusion. Consequently, one previous method for fabricating through holes involved etching (111) plane troughs into a back surface of a wafer opposite the upper circuit surface so that the troughs would just intersect the upper surface of the wafer. A fundamental problem with etching only through the back surface of the wafer is that the width of the opening on the unetched upper surface is a function of the wafer thickness Since it is not uncommon for wafers to have variations in thickness, it has not been possible to precisely locate openings on the circuit side of the wafer. For example, if the etch mask is designed to produce a through hole H adjacent the integrated circuit IC and just reaching the upper integrated circuit surface CS of a 20 mil thick wafer $W_1$ (see FIG. 1B), it will actually produce a 1.4 mil wide opening on a 19 mil thick wafer $W_2$ (FIG. 1A) and will not produce any opening at all on a 21 mil thick wafer $W_3$ (FIG. 1C).

The effect of variations in wafer thickness is addressed in U.S. Pat. No. 4,169,008 to Kurth, the disclosure of which is herein incorporated by reference. Kurth discloses a method of forming an ink jet nozzle in a (100) silicon wafer by etching through obverse and reverse surfaces of the wafer. The method does not produce butt edges and is not performed after integration circuit fabrication on the wafer. The etch resistant layer used by Kurth '008 is not plasma silicon nitride.

Thermal ink jet printers contain printheads, such as roofshooter printheads shown in FIG. 2 and described in U.S. Pat. No. 4,789,425 to Drake et al (the disclosure of which is herein incorporated by reference). The printheads are constructed from silicon wafer subunits (or chips) 1 which include nozzles 2, reservoirs 3 for conducting ink to the nozzle outlets and integrated circuitry 4. The integrated circuitry includes a resistive heater element which responds to an electrical impulse to vaporize a portion of the ink in a passageway 6 which provides the motive force to form an ink drop which is expelled onto a recording medium. Some printheads, such as sideshooter printheads shown in FIG. 3 and described in U.S. Pat. No. 4,601,777 to Hawkins et al (the disclosure of which is herein incorporated by reference), are formed from a number of wafer subunits $S_1$, $S_2$, $S_3$ butted together and layered upon a support substrate. The sideshooter printhead includes nozzles 7 and resistive heater element circuitry 8 located on a heater substrate 9 for controlling ink output from each nozzle 7. In each case, the printhead is wired to a daughter board, placed in communication with a source of ink and mounted on a carriage of an ink jet printer for reciprocation across the surface of a recording medium, such as paper. Alternatively, a pagewidth array of wafer subunits, as shown in FIG. 4, can be formed by butting together a plurality of subunits $S_1$, $S_2$, $S_3$ into the length of a pagewidth. In a pagewidth array configuration, the array is fixed and the recording medium moves at a constant velocity in a direction perpendicular to the array.

Since silicon wafers are not currently available having a length corresponding to a pagewidth, the current practice is to form the nozzles, passageways and integrated circuitry on silicon wafers, separate these wafers into wafer subunits (or chips) which contain butt surfaces or edges, align these subunits along their butt surfaces or edges into an array having a length of a pagewidth, and attach the array to a substrate to form a pagewidth printhead. The layering of the wafers, if necessary, to form the complete printhead can be performed before or after separation into subunits. Since many wafer subunits are aligned to form an array, each subunit must be uniform. In order for the subunits to be uniform, the location of the butt edges or surfaces relative to the circuitry must be precise. Additionally, since the step of separating a wafer into subunits is performed as a batch, well prior to the step of aligning the subunits into arrays, the later step usually involves selecting subunits from a bin which contains subunits having a variety of thicknesses. When the subunits $S_1$, $S_2$ are formed with diagonal butt surfaces, a difference in height $\Delta h$ between adjacent subunits results in a lateral shift 0.7 $\Delta h$ of the circuit surfaces CS of these subunits (see FIG. 5).

One previous technique for forming butt edges, shown in FIGS. 6A–6B, involves orientation dependent etching a groove 10 on one surface of the wafer, placing a dice cut 11 in the opposite surface of the wafer and applying a force F to fracture break the wafer along line 12 into subunits to produce butt edges 13. Adjacent subunits are then butted together at the butt edges 13 (FIG. 6B). Disadvantages of this technique are: the fracture edges can produce cracked passivation up to 50 micrometers away, the butt edges 13 are razor edges which are easily damaged, and any difference in chip thickness $\Delta h$ between two subunits results in a lateral shift of 0.7 $\Delta h$ of one chip surface relative to the other. This lateral shift is due to the angle of the (111) etched surfaces.

Another previous method for forming butt surfaces, illustrated in FIG. 3, involves orientation dependent etching troughs entirely through the wafer, giving a parallelogram cross section to the wafer. By this method, the butt surfaces 15, 16 are crystal (111) planes. Advantages of this method are (1) the butt surfaces are formed gently by wet etching, and (2) the butt surface is a robust crystal plane. A disadvantage is that two separate through etches are required and the area between the butted surfaces is so large that dirt particles can prevent intimate butting.

Another previous method, illustrated in FIGS. 7A and 7B, which requires only one through etch, involves making at least one through etch 20 on one surface of the wafer to define a first butt edge 21 and dividing the wafer into DIE 1 and DIE 2, forming a trough 22 on the other surface of the wafer, and then making a dice cut 23 through the trough 22 to form a second butt edge 24. The first butt edge 21 of each subunit is butted against the second butt edge 24 of an adjacent subunit (FIG. 7B) to form the array. This method reduces the amount of etch time required and also reduces the butt edge area. However since a dice cut is required, it is possible to produce cracked passivation. This method also is susceptable to a lateral displacement of 0.7 $\Delta h$ due to differences in adjacent chip height $\Delta h$.

A further previous method, illustrated in FIGS. 8A and 8B, involves producing butt edges by reactive ion etching (RIE) from the circuit surface to a groove G cut into the base surface. This method is advantageous in that it produces vertical butt surfaces 25, 26 and thus differences in the height of adjacent butting chips do not result in lateral displacements. A disadvantage is that the RIE trenches must be etched prior to metal oxide silicon (MOS) fabrication due to potential oxide damage from the high energy ions.

U.S. Pat. No. 4,601,777 to Hawkins et al discloses thermal ink jet printheads which are formed in (100) silicon wafers. The wafers can be separated into subunits to form printheads and the printheads can be aligned into pagewidth arrays. The wafers are separated into printheads by dicing.

U.S. Pat. No. 4,612,554 to Poleshuk discloses a thermal ink jet printhead and method of making same. The printheads are formed from (100) silicon wafers on which the integrated circuits are fabricated after application of an etch resistant pyrolytic silicon nitride layer. Poleshuk discloses dicing to form butt edges.

U.S. Pat. No. 4,784,721 to Holmen et al discloses a process for fabricating a thin film microsensor for airflow. The process only etches through a back surface of a (100) silicon wafer, does not provide a through hole in the wafer and does not discuss the fabrication of butt edges.

OBJECTS OF THE INVENTION

It is an object of the present invention to form precision through holes in (100) silicon wafers using orientation dependent etching, particularly after fabrication of the integrated circuit on the wafer.

It is another object of the present invention to fabricate (100) silicon wafer subunits having precision butt edges.

Another object of the present invention is to fabricate pagewidth printheads by precisely aligning adjacent (100) silicon wafer subunits.

SUMMARY OF THE INVENTION

The present invention makes use of an etchant material, e.g. plasma silicon nitride, which can be applied at a relatively low temperature between 250° C. and 450° C., preferably 350° C., which enables masking of the IC side of the wafer without silicon-aluminum interdiffusion.

In the present invention, an integrated circuit is fabricated on a (100) silicon wafer. After fabrication of the IC, an etch resistant layer is applied on circuit and base surfaces of the wafer. These etch resistant layers are patterned to form upper and lower etch openings and the wafer is anisotropically etched to form upper and lower recesses which correspond to the upper and lower etch openings. These upper and lower recesses intersect one another to form a through opening which is precisely aligned with the integrated circuitry on the wafer.

The wafer can then be separated along the through holes to form wafer subunits (or chips) which have precisely defined butt edges. These butt edges are formed without dicing thereby reducing the risk of damage to the passivation layer of the wafer. The wafer subunits can be aligned in an array to form a pagewidth ink jet printhead or any other type device requiring an extended array of (100) silicon wafer subunits.

BRIEF DESCRIPTION OF THE DRAWINGS

The invention will be described in detail with reference to the following illustrations in which:

FIG. 2 shows one type of ink jet printhead;

FIG. 3 shows an array of ink jet printheads;

FIG. 4 shows another array of ink jet printheads;

DETAILED DESCRIPTION OF PREFERRED EMBODIMENTS

The present invention involves fabricating a through opening of predetermined dimensions in a (100) silicon wafer by orientation dependent etching after the fabrication of integrated circuits on the wafer. The opening extends through the wafer between the circuit surface of the wafer and the parallel base surface of the wafer. By this method, the through opening can be precisely located relative to the integrated circuit on the circuit surface of the wafer. Butt edges or surfaces can then be formed along the through openings so that the butt edges or surfaces have the precise location and dimensions of the through opening.

As illustrated in FIG. 9, a (100) wafer 30, preferably of silicon, is supplied having an upper surface 31 (hereafter referred to as the circuit surface) and an opposite base surface 32. The (100) wafer includes a (100) plane defined in terms of mono-crystalline silicon electrophysical geometry as a plane parallel to surfaces of the parallel-piped structure of the crystal. The upper and base surfaces are generally within ±1° of this (100)

plane. Another plane of crystalline silicon generally diagonally of the (100) plane, and known to the artisan as the (111) plane, lies at an angle, for silicon, of 54.7° to the (100) plane. The present invention makes use of the selection of an etchant which etches through the (100) planes much faster than the (111) planes.

Figure 1A:
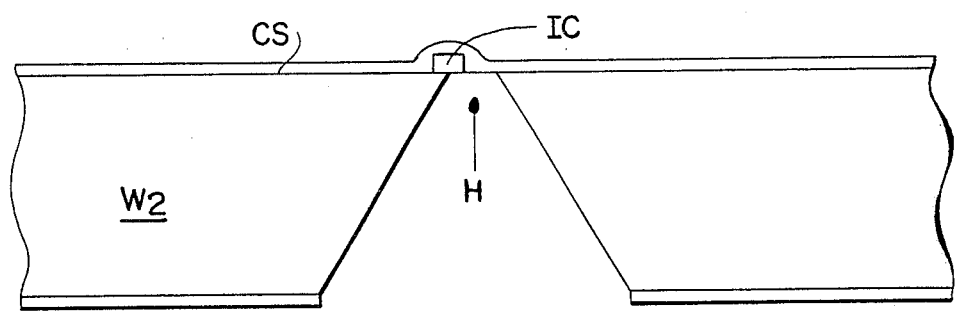
FIGS. 1A-1C show a prior art method of forming butt edges by anisotropically etching only through a base surface of a wafer.
Figure 1B:
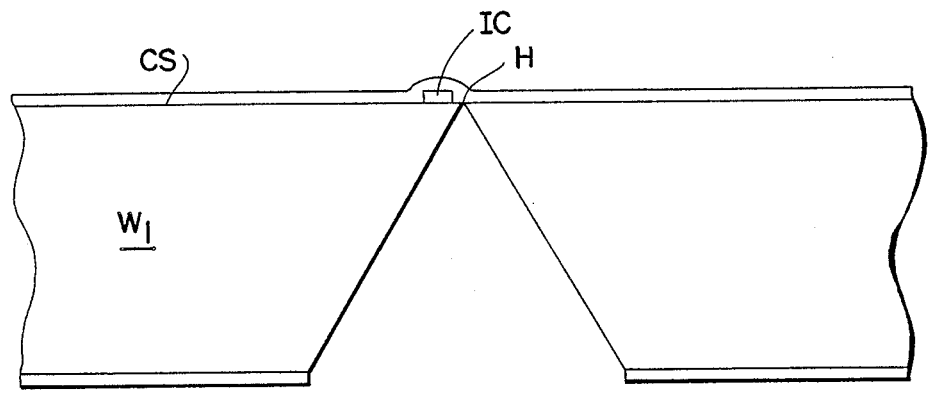
Figure 1C:
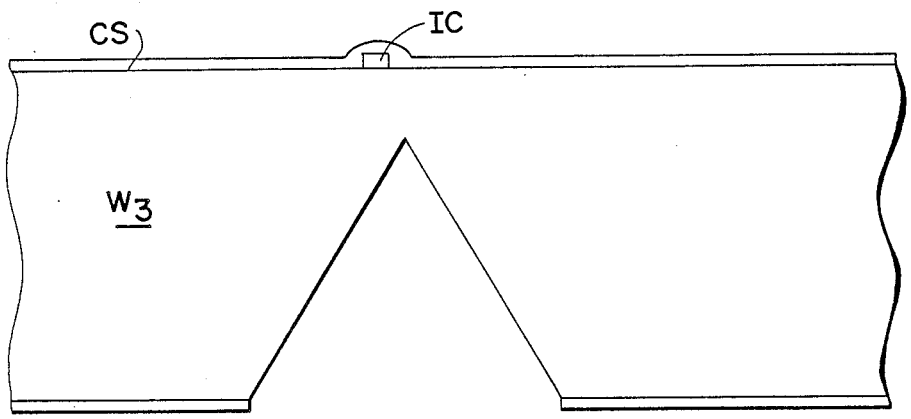
Figure 5:
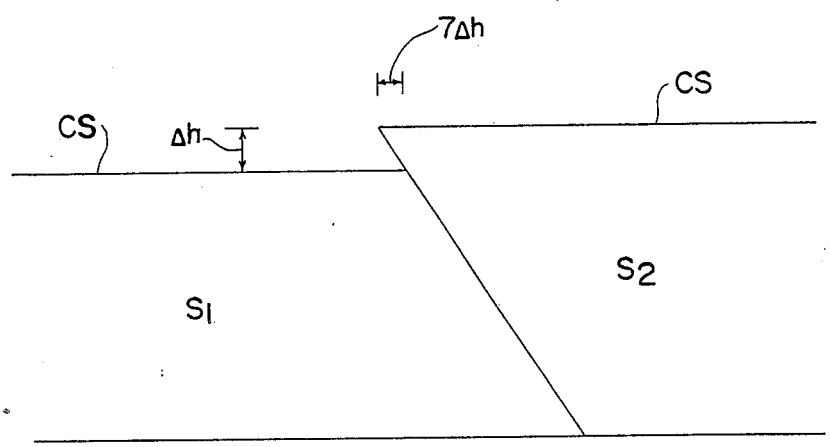
FIG. 5 shows wafer subunits having different thicknesses butted against one another.
Figure 6A:
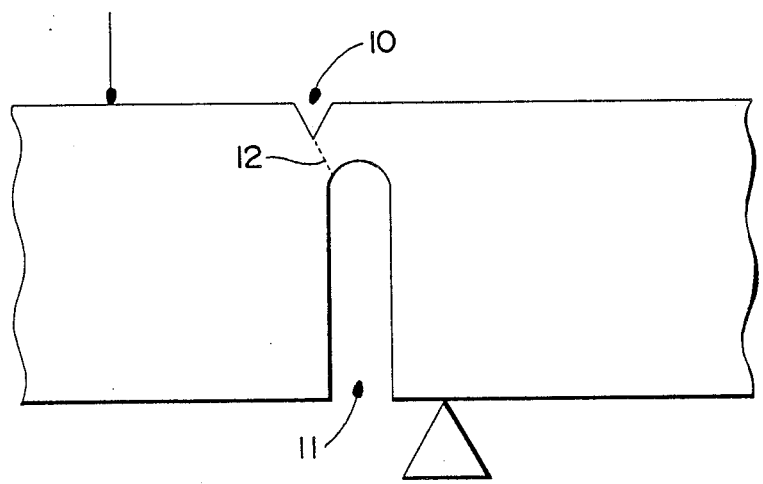
FIGS. 6A-6B show a prior art method of forming butt edges by fracturing.
Figure 6B:
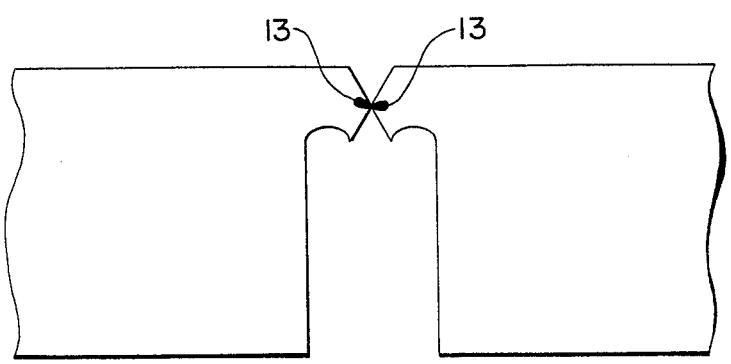
Figure 7A:
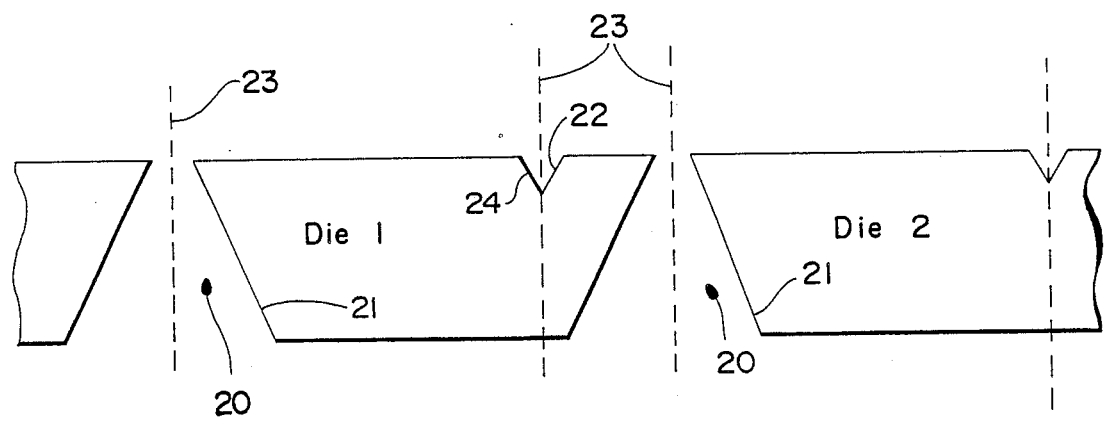
FIGS. 7A and 7B show a prior art method of forming butt edges by anisotropic etching and dicing.
Figure 7B:
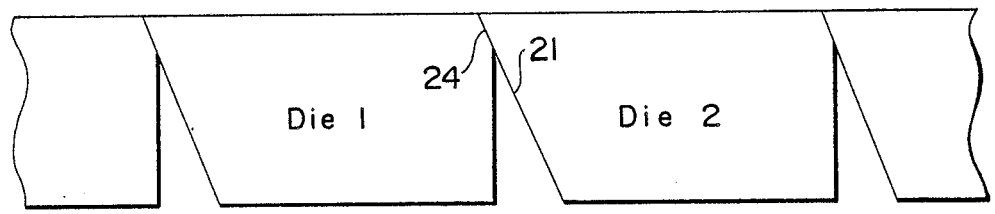
Figure 8A:
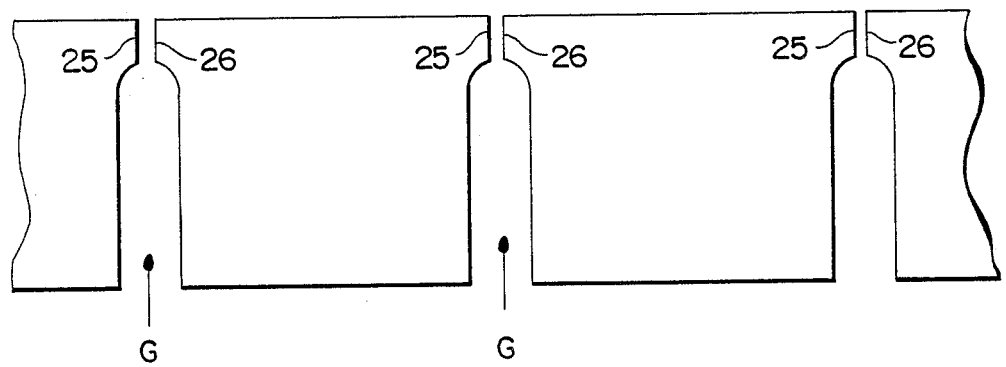
FIGS. 8A and 8B show a prior art method of forming butt edges by reactive ion etching.
Figure 8B:
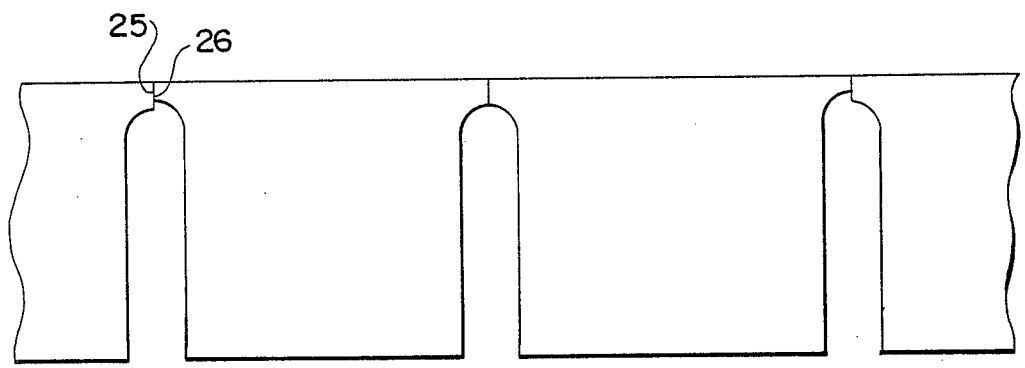
Figure 9A:
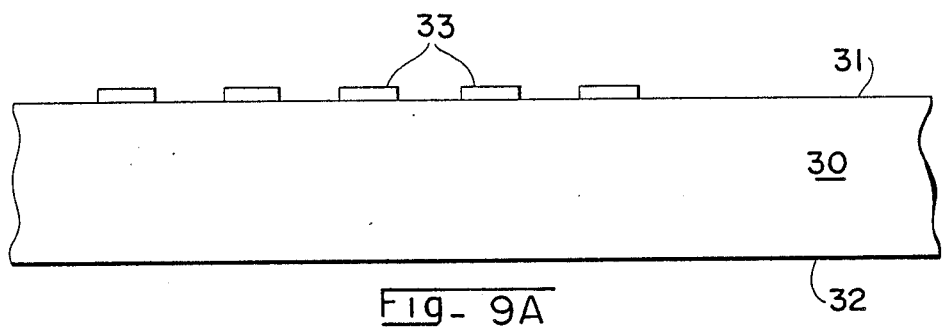
FIGS. 9A-9F show an embodiment of the present invention.
Figure 9B:
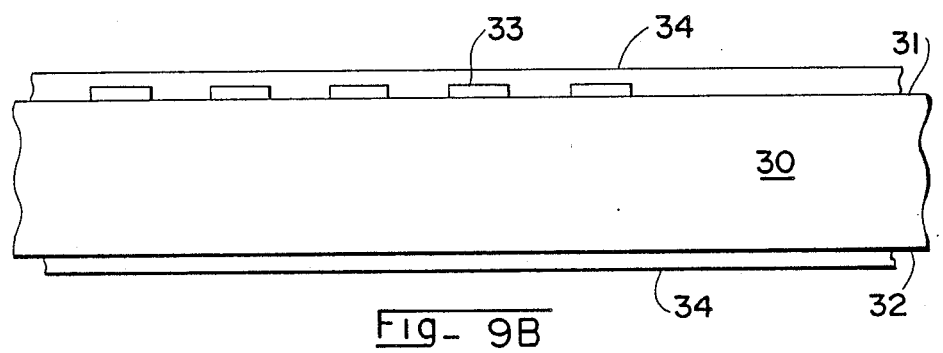
Figure 9C:
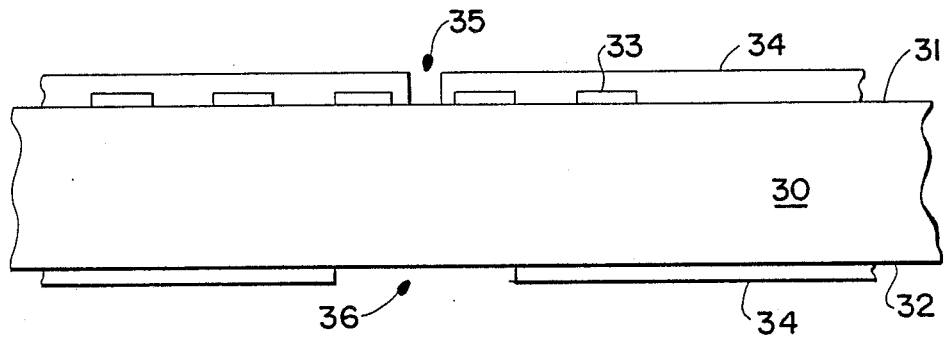
Figure 9D:
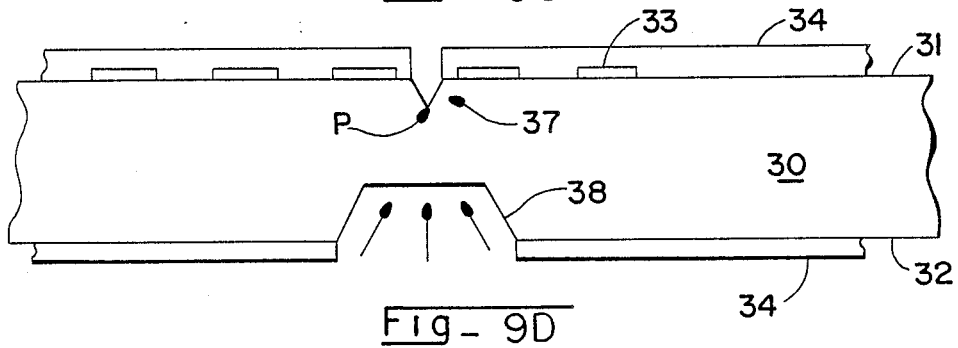
Figure 9E:
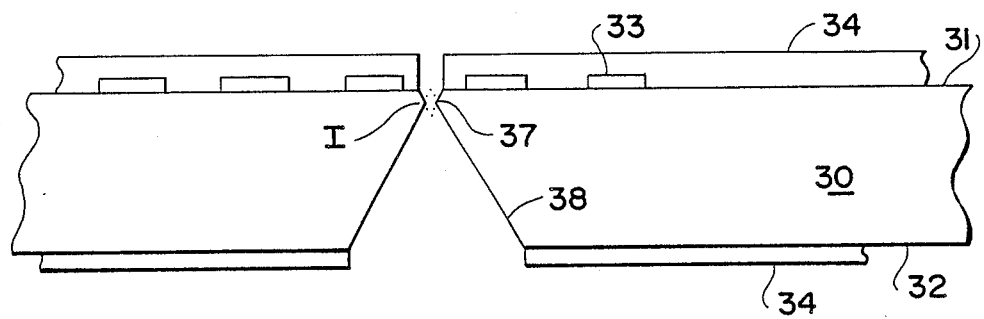
Figure 9F:
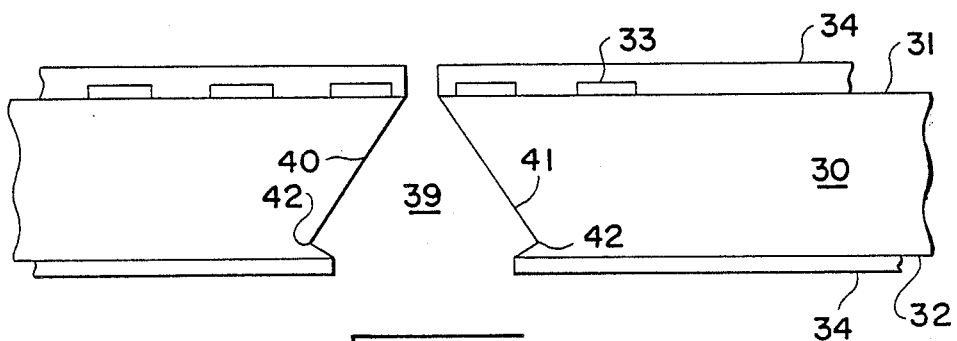

A (100) silicon wafer 30 having circuit and base surfaces 31 and 32, respectively, is obtained and the integrated circuitry 33 is fabricated on the circuit surface of the wafer. An etch resistant layer 34 (FIG. 9b) of plasma silicon nitride is formed on the circuit and base surfaces of the wafer. The etch resistant plasma silicon nitride layer on the circuit surface is patterned to produce an upper etch opening 35 (FIG. 9c) having a precise location and precise dimensions which define the predetermined location and dimensions of the through opening. The plasma silicon nitride layer on the base surface is patterned to produce a lower etch opening 36 which is aligned with the upper etch opening 35 within a predetermined tolerance. The wafer is then anisotropically etched to produce a first recess 37 (FIG. 9D) corresponding to the upper etch opening 35 in the circuit surface of the wafer and a second recess 38 corresponding to the lower etch opening in the base surface of the wafer. The first recess 37 terminates at point P, but the second recess 38 continues to etch toward the first recess 37 as illustrated by the arrows in the second recess. Each of these first and second recesses are bounded by (111) plane sidewalls. The anisotropic etching of the second recess 38 eventually intersects the first recess 37 (FIG. 9E) to form a through opening 39 bounded by (111) plane sidewalls 40, 41 (FIG. 9F). This through opening has its dimensions and location defined by the patterning of the upper etch opening on the circuit surface of the wafer.

During etching, the (111) planes of the first recess 37 are rapidly etched and exchanged for the (111) planes parallel to those of the second recess 38 because, at the external intersection I of the (111) planes of the first and second recesses (FIG. 9E), etching occurs rapidly relative to the etch rate perpendicular to the (111) planes. However, while the original (111) planes of the first recess 37 are rapidly etched away, a new set of (111) planes emerge, which are also determined by the pattern for the upper etch opening 35. This creates an etch ledge 42 which moves toward and finally terminates at the pattern for the lower etch opening 36. Two internally intersecting (111) planes intersect at the etch ledge 42 and terminate the etching.

As noted above, the invention employs etch patterns on opposite sides of the wafer. The pattern for the lower etch opening 36 is to etch through the wafer while the pattern for the upper etch opening 35 (which is usually smaller than the pattern for the lower etch opening) is designed to control the placement and dimensions of the entire through opening.

The present invention makes use of an etch resistant material which is applied at a temperature in the range of 250° C. to 450° C. This enables the etch resistant layer to be applied over the integrated circuit without causing silicon-aluminum interdiffusion, which would occur if a high temperature (800° C.) pyrolytic silicon nitride etch resistant material were applied. Although plasma silicon nitride is a preferred etch resistant material, other materials can be used so long as they can be applied at a temperature in the range of 250° C. to 450° C., preferably about 350° C.

By this method, the location and dimensions of a through opening are controlled by the etch opening formed in the circuit surface of the wafer regardless of the thickness of the wafer between the circuit and base surfaces. This is one important advantage since previous methods were prone to errors in through opening location due to variations in wafer thickness.

One method of applying the etch resistant layer to both the circuit and base surfaces makes use of a graphite boat. The etch resistant layer is first applied to one of the surfaces, e.g. the circuit surface, to form a first coated surface. The first coated surface is then placed on a graphite boat and the etch resistant layer is applied to the other surface. Either surface can be coated first. Alternative methods of coating the wafer can be employed so long as both the circuit and base surfaces are sufficiently coated with the etch resistant layer.

The step of patterning the etch resistant layer to form the upper and lower etch openings can be done using a double sided aligner, although alternative methods can also be used. The etch pattern on the circuit side of the wafer serves to define the precise opening of the ODE through hole, as well as precisely define its location. The etch pattern on the back side of the wafer is usually larger and serves to provide most of the through etch. Consequently, the lower etch opening need not be located as precisely as the upper etch opening. However, the lower etch opening must be aligned with the upper etch opening within a predetermined tolerance so that the recess formed during anisotropic etching intersects the recess which corresponds to the upper etch opening in the circuit surface.

Figure 10A:
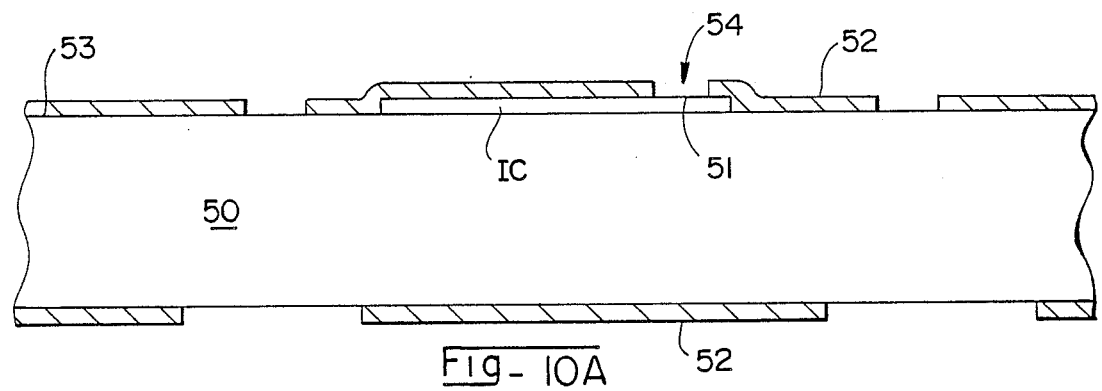
FIGS. 10A-10D show a second embodiment of the present invention where contact pad vias are formed.
Figure 10B:
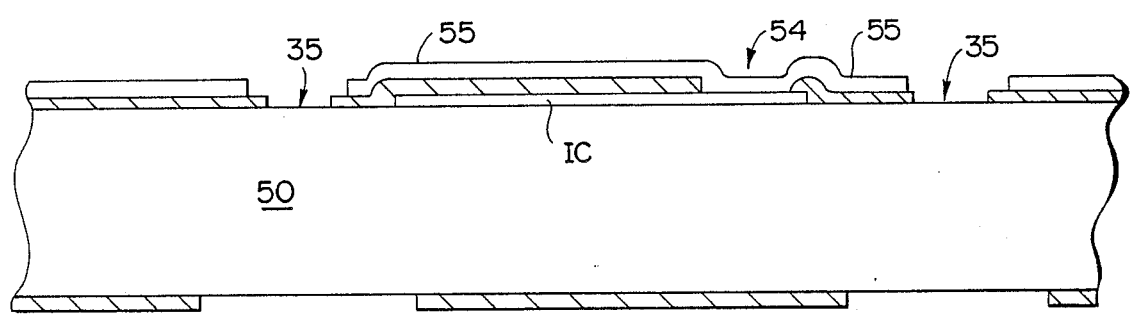
Figure 10C:
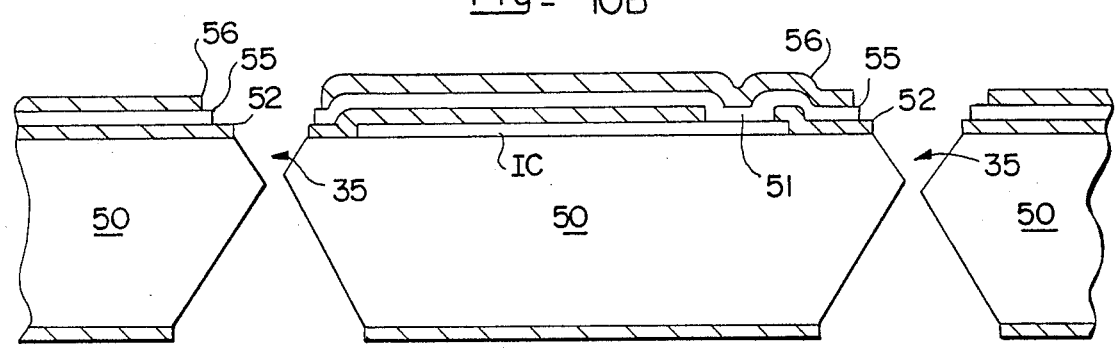
Figure 10D:
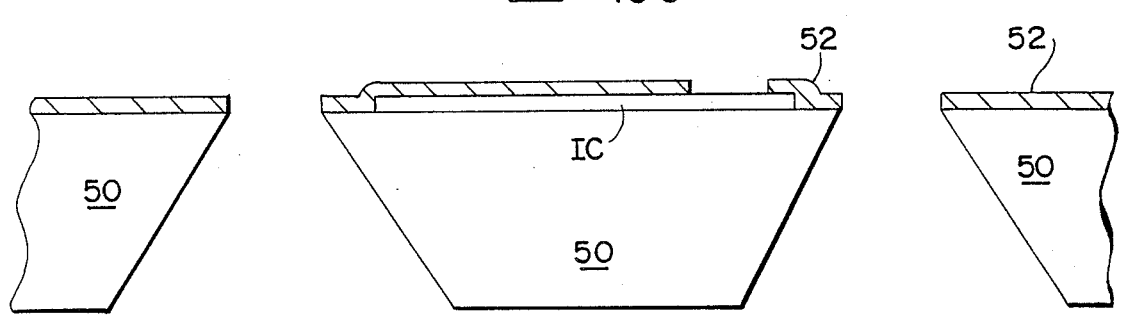

In one preferred embodiment of the present invention, illustrated in FIGS. 10A–10D, the wafer 50 is fabricated to provide for opening the contact pad 51 of the integrated circuit wafer after the anisotropic etch is completed. In this embodiment, the etch resistant layer 52 applied to the circuit surface 53 is patterned to produce a contact pad opening 54 at a predetermined location on the integrated circuit IC (FIG. 10A). A low temperature oxide layer 55 is applied over the circuit surface to expose the upper etch opening 35 but cover the contact pad opening 54 (FIG. 10B). This low temperature oxide layer can be applied by chemical vapor deposition (CVD). An additional etch resistant layer 56 is applied over the low temperature oxide layer 55 and is also patterned to expose the upper etch opening 35 and cover the contact pad opening 54 (FIG. 10C). After the wafer is anisotropically etched, the additional etch resistant layer 56 is removed, exposing the low temperature oxide layer 55, which is subsequently removed to expose the original etch resistant layer 52 having the contact pad opening (FIG. 10D). This permits the contact pad to be wire banded. The additional etch resistant layer 56 can be removed by, e.g., a $CF_4/O_2$ plasma or hot phosphoric acid. The low temperature oxide is easily removed in, e.g., a buffered HF solution.

Since the method of the present invention enables through etched holes to be precisely defined (both dimensionally and positionally) by standard photolithography on the integrated circuit side of the wafer, it finds use in a number of applications. The method can be used to produce butt edges on chips without any mechanical steps, which is beneficial in that it reduces the number of work stations required and prevents passivation layer damage. The present invention can also be used to precisely define through wafer fill holes for "roofshooter" thermal ink jet printheads. The present invention can be used as an alternative to wafer dicing in which the separation lines are fabricated by chemical etching, followed by fracture separation along the etched lines.

Figure 11A:
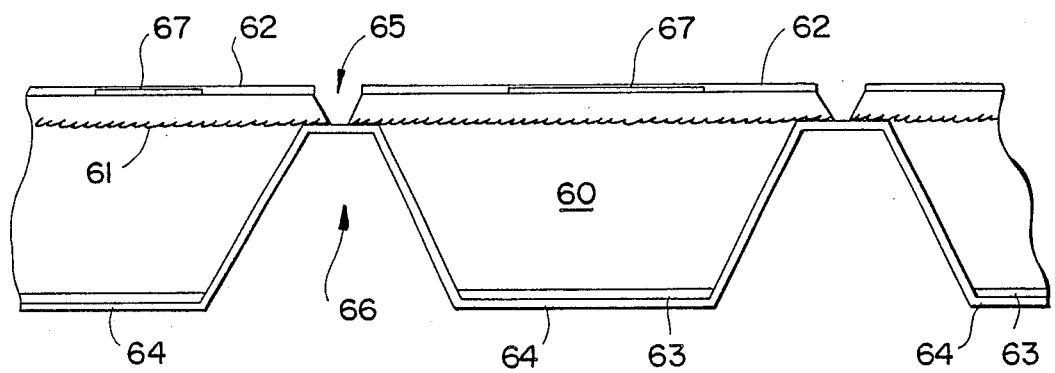
FIGS. 11A and 11B show yet another embodiment of the present invention.
Figure 11B:
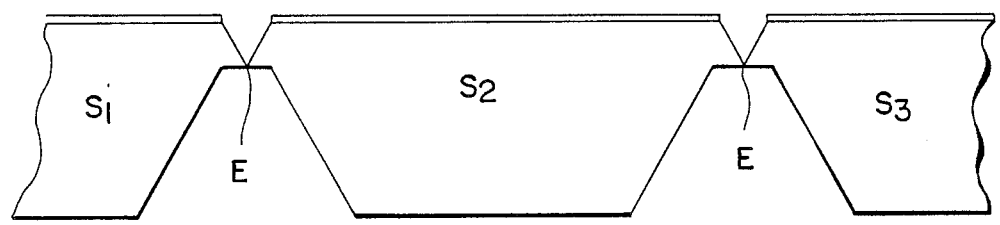

Another embodiment of the present invention, illustrated in FIGS. 11A and 11B, controls the anisotropic etching of the first and second recesses 65, 66 so that the etching stops at first and second predetermined depths between the circuit and base surfaces of the wafer. This method finds particular application in fabricating wafer subunits having buttable edges located at a uniform distance below the circuit surface of the wafer.

One method for producing a buttable edge in a (100) silicon wafer with the buttable edge located between a circuit surface of the wafer and an opposite parallel base surface of the wafer involves controlling the etching of the lower base surface of the wafer to stop at a depth less than the thickness of the wafer. A (100) silicon wafer 60 (FIG. 11A) is obtained and the integrated circuits 67 are fabricated on the circuit surface of the wafer. An etch resistant layer 62, 63 is applied onto the circuit and base surfaces of the wafer in a manner similar to that described above. As stated earlier, the etch resistant layer should be applied at a temperature between 250° C. and 450° C., and is preferably plasma silicon nitride, if the etch resistant layer is to be applied after the integrated circuits have been fabricated on the circuit surface of the wafer. Next, the etch resistant layer on the base surface is patterned to produce a lower etch opening. The wafer is anisotropically etched to produce a recess 66 (FIG. 11A) corresponding to the lower etch opening in the base surface of the wafer and bounded by (111) plane sidewalls. This recess 66 has a first predetermined depth less than the thickness of the wafer. Another etch resistant layer 64 is reapplied onto the base surface to prevent further etching of the recess 66. The circuit surface of the wafer is then patterned with an etch resistant material to produce an upper etch opening having a predetermined location in alignment with the recess 66 and predetermined dimensions with respect to the integrated circuits. The wafer is anisotropically etched to produce a trough 65 corresponding to the upper etch opening in the circuit surface and bounded by (111) plane sidewalls. The anisotropic etching of the trough 65 continues to a second predetermined depth so as to intersect the recess and form the buttable edge E defined by the intersection of the (111) plane sidewalls of the recess 66 and trough 65. Adjacent subunits $S_1$, $S_2$, $S_3$ are then butted together along their buttable edges E (FIG. 11B).

One way to control the depth of etching is to implant or diffuse a relatively shallow (e.g., 2 micrometer) p+ region 61 into the silicon wafer prior to circuit fabrication. After completion of the IC's, application and patterning of the etch resistant layers is performed. An etchant which is dopant sensitive such as, e.g., KOH is chosen so that etching is considerably slowed when the p+ region is reached, thus ensuring that a thin (e.g., 2 micrometer) reproducible silicon layer will remain. Thus, provided that the p+ region is able to sufficiently slow the etch, the depth of the etch from the base surface can be controlled to stop at a depth less than the thickness of the wafer and a uniform distance from the circuit surface of the wafer.

Thus, the anisotropic etching of the wafer to form the trough of predetermined depth in the circuit surface defines the location of the buttable edge by controlling the intersection of the (111) plane sidewalls of the recess and trough. Additionally, the location, size and alignment of the etch openings on the base surface are not critical since the point of intersection of the upper trough and lower recess is controlled by the depth of the lower recess and size of the upper trough. This method is useful for, e.g., producing printhead wafer subunits which are then aligned in series with their butting edges adjacent to and butting against one another in a length corresponding to a page width. This series of aligned wafer subunits is then secured to a support substrate having a length corresponding to a pagewidth. Since the butt edges are small, the possibility of dirt contaminating the butting surfaces is reduced.

Figure 12A:
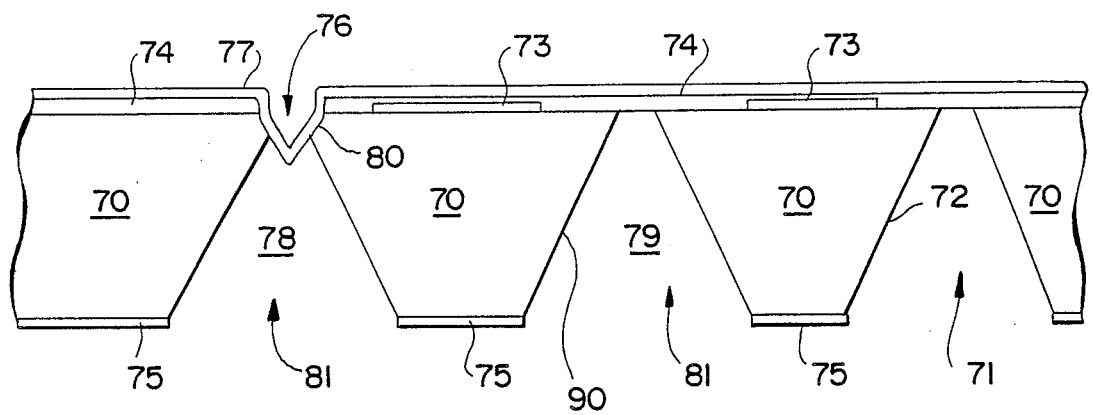
FIGS. 12A and 12B show a further embodiment of the present invention.
Figure 12B:
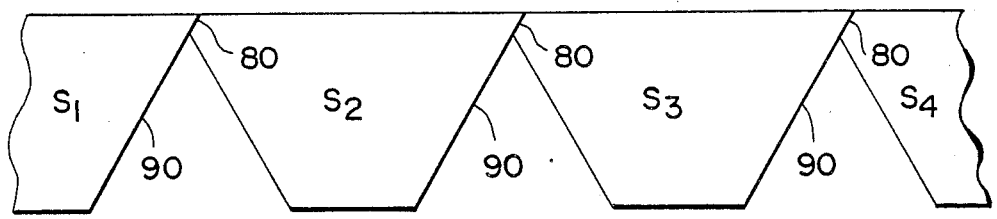

As illustrated in FIGS. 12A and 12B, a further method for producing a buttable surface in a silicon (100) wafer by orientation dependent etching after processing of integrated circuits on the wafer involves etching the circuit surface first. An alignment hole 71 is formed at a periphery of a (100) silicon wafer 70 by orientation dependent etching, the alignment hole defining a (111) plane surface 72. Integrated circuits 73 are fabricated on the circuit surface in alignment with the (111) surface 72 of the alignment hole 71. An etch resistant layer 74, 75 (e.g., plasma silicon nitride) is applied on the circuit and base surfaces of the wafer. The etch resistant layer on the circuit surface is patterned to produce an upper etch opening which is then anisotropically etched to produce a trough 76 corresponding to the upper etch opening and bounded by (111) plane sidewalls, the trough having a first predetermined depth and defining a first buttable (111) surface 80. The anisotropic etching is stopped and an etch resistant layer 77 is reapplied on the circuit surface to prevent further etching of the trough 76. The etch resistant layer on the base surface is patterned to produce two spaced lower etch openings 81, 81, each opening being located on the base surface at a predetermined location with respect to the alignment hole 71. A first one 81 of the openings is aligned with the trough 76. The wafer is anisotropically etched to produce two recesses 78, 79 each corresponding to one of the lower etch openings and bounded by (111) plane sidewalls. A first lower recess 78, corresponding to the first one 81 of the lower etch openings, has a second predetermined depth sufficient to intersect the trough 76. The other recess 79 is permitted to anisotropically etch through the wafer to define a second buttable surface 90 parallel to a (111) plane surface 72 of the alignment hole. Upon separation, the subunits are butted with the first buttable surface 80 of one subunit contacting the second buttable surface 90 of an adjacent subunit. This method produces subunits with precise, robust butting edges with no mechanical or ion beam damage.

While the present invention has been described with reference to forming through openings those skilled in the art recognize that the through opening may define buttable surfaces for butting adjacent subunits together in a precisely aligned array. For example, multiple subunits may be formed from a single wafer by ODE of the wafer in accordance with the present invention and dividing the wafer into the subunits along the buttable surfaces formed by the ODE.

Further, the present invention has been described by formation of through holes after formation of integrated circuitry on the wafer. However, the invention is applicable equally to manufacture of wafers prior to integrated circuit fabrication, for example by providing a method of cutting wafers into subunits without dicing.

The invention has been described with reference to the embodiments thereof which are intended to be illustrative rather than limiting. Various changes and modifications may be made without departing from the spirit and scope of the invention as defined in the following claims.

What is claimed is:

1. A method of fabricating at least one through opening of predetermined dimensions in a (100) silicon wafer by orientation dependent etching after completion of integrated circuits on the wafer, the opening extending through the wafer between a circuit surface of the wafer and an opposite parallel base surface of the wafer and having a predetermined location relative to the integrated circuit on the circuit surface of the wafer, the method comprising the steps of:

fabricating the integrated circuit on the circuit surface of the wafer;

applying an etch resistant layer of plasma silicon nitride on the circuit and base surfaces of the wafer;

patterning the etch resistant plasma silicon nitride layer on the circuit surface to define an upper etch opening having a location and dimensions which define the predetermined location and dimensions of the through opening;

patterning the plasma silicon nitride layer on the base surface to produce a lower etch opening aligned with the upper etch opening within a predetermined tolerance; and anisotropic etching the wafer to produce a first recess corresponding to the upper etch opening in the circuit surface and a second recess corresponding to the lower etch opening in the base surface, each of the first and second recesses being bounded by (111) plane side walls, the anisotropic etching of the second recess intersecting the first recess to form the through opening bounded by (111) plane side walls and having its predetermined dimensions and location defined by the patterning of the upper etch opening.

2. The method of claim 1 wherein the layer of etch resistant plasma silicon nitride is applied at a temperature in the range of 250° C. to 450° C.

3. The method of claim 2 wherein the layer of etch resistant plasma silicon nitride is applied at a temperature of about 350° C.

4. The method of claim 1 wherein the anisotropic etching of the first and second recesses forms the through hole with the predetermined dimension regardless of thickness of the wafer between the circuit and base surfaces.

5. The method of claim 1 wherein the step of applying the etch resistant layer of plasma silicon nitride on the circuit and base surfaces of the wafer includes the steps of applying the etch resistant plasma silicon nitride layer on one of the circuit and base surfaces to form a first coated surface, placing the first coated surface on a graphite boat, and applying the etch resistant plasma silicon nitride layer on the other of the circuit and base surfaces to form a second coated surface.

6. The method of claim 5 wherein the first coated surface is the circuit surface.

7. The method of claim 1 wherein the steps of patterning the plasma silicon nitride layer on the circuit and base surfaces are performed by using double side aligning etch patterns on the circuit and base surfaces.

8. The method of claim 1 wherein the lower etch opening is larger than the upper etch opening.

9. The method of claim 1 wherein the anisotropic etching of the first and second recesses forms the through hole with the predetermined dimensions and location regardless of misalignment within the predetermined tolerance of the upper and lower etch openings provided the first and second recesses intersect during anistropic etching.

10. The method of claim 1 wherein the step of patterning the etch resistant plasma silicon nitride layer on the circuit surface comprises the steps of:

additionally patterning the etch resistant plasma silicon nitride layer on the circuit surface to produce a contact pad opening at a predetermined location on the circuit surface;

applying a low temperature oxide layer over the circuit surface to expose the upper etch opening and cover the contact pad opening;

applying an additional plasma silicon nitride layer over the low temperature oxide layer, the additional plasma silicon nitride layer being patterned to expose the upper etch opening and cover the contact pad opening; and further comprising, after the step of anisotropic etching, removing the additional plasma silicon nitride layer to expose the low temperature oxide layer and subsequently removing the low temperature oxide layer to expose the plasma silicon nitride layer having the contact pad opening.

11. The method of claim 1 wherein the through opening bounded by (111) plane side walls subsequently serves to define a butting surface for the wafer.

12. The method of claim 1 wherein the through openings bounded by (111) plane side walls subsequently serves as an ink conduit in a wafer used to form a printhead for an ink jet printing device.

13. The method of claim 1 wherein a plurality of through openings are formed in the wafer and the silicon wafer is separated into subunits along each through opening, the (111) plane side walls of the through openings defining butting surfaces on opposite sides of each subunit.

14. The method of claim 1 wherein the anisotropic etching of the first and second recesses is controlled to stop the etching at first and second predetermined depths, respectively, the through opening formed by the intersection of the first and second recesses including a buttable edge defined by the intersection of the (111) plane side walls of the first and second recesses and located at a distance corresponding to the first predetermined depth from the circuit surface.

15. The method of claim 1 wherein the anisotropic etching of the first and second recess continues through the wafer to form the through opening with an etch ledge adjacent to the base surface.

16. A method for producing a buttable edge in a (100) silicon wafer by orientation dependent etching after processing of integrated circuits on the wafer, the edge being located between a circuit surface of the wafer and an opposite parallel base surface of the wafer, the method comprising the steps of:

fabricating the integrated circuits on the circuit surface of the wafer;

applying an etch resistant layer of plasma silicon nitride on the circuit and base surfaces of the wafer;

patterning the plasma silicon nitride layer on the base surface to produce a lower etch opening;

anisotropic etching the wafer to produce a recess corresponding to the lower etch opening in the base surface and bounded by (111) plane side walls, the recess having a first predetermined depth less than the thickness of the wafer;

reapplying an etch resistant plasma silicon nitride layer on the base surface to prevent further etching of the recess;

patterning the etch resistant plasma silicon nitride layer on the circuit surface to produce an upper etch opening having a predetermined location in alignment with the recess and predetermined dimensions with respect to the integrated circuits; and anisotropic etching the wafer to produce a trough corresponding to the upper etch opening in the circuit surface and bounded by (111) plane side walls, the anisotropic etching of the trough continuing to a second predetermined depth to intersect the recess and form the buttable edge defined by the intersection of the (111) plane side walls of the recess and trough.

17. The method of claim 16 wherein the anisotropic etching of the wafer to form the trough of predetermined depth in the circuit surface defines the location of the buttable edge by controlling the intersection of the (111) plane side walls of the recess and trough.

18. The method of claim 16 further comprising the step of butting the buttable edge of one wafer against a buttable edge of an adjacent wafer.

19. A method for producing a buttable surface in a silicon (100) wafer by orientation dependent etching after processing of integrated circuits on the wafer, the buttable surface being located between a circuit surface of the wafer and an opposite parallel base surface, the method comprising the steps of:

forming by orientation dependent etching an alignment hole at a periphery of the wafer to define a (111) plane surface;

fabricating the integrated circuits on the circuit surface in alignment with the (111) surface;

applying an etch resistant layer of plasma silicon nitride on the circuit and base surfaces of the wafer;

patterning the etch resistant silicon nitride layer on the circuit surface to produce an upper etch opening;

anisotropic etching the wafer to produce a trough corresponding to the upper etch opening and bounded by (111) plane side walls, the trough having a first predetermined depth and defining a first buttable (111) surface;

reapplying an etch resistant plasma silicon nitride layer on the circuit surface to prevent further etching of the trough;

patterning the etch resistant silicon nitride layer on the base surface to produce two spaced lower etch openings, each opening being located on the base surface at a predetermined location with respect to the alignment hole, a first one of the openings being aligned with the trough; and anisotropically etching the wafer to produce two recesses each corresponding to one of the lower etch openings and bounded by (111) plane side walls, a first one of the recesses corresponding to the first one of the lower etch openings having a second predetermined depth sufficient to intersect the trough, the anisotropic etching of the other of the recesses continuing through the wafer to define a second buttable surface parallel to a (111) plane surface of the alignment hole.

20. The method of claim 19 further comprising the step of butting the first buttable surface of one wafer against the second buttable surface of an adjacent wafer.

21. A method for producing a buttable edge in a (100) silicon wafer by orientation dependent etching, the edge being located between an upper surface of the wafer and an opposite base surface of the wafer, the method comprising the steps of:

applying an etch resistant layer on the upper and base surfaces of the wafer;

patterning the etch resistant layer on the base surface to produce a lower etch opening;

anisotropic etching the wafer to produce a recess corresponding to the lower etch opening in the base surface and bounded by (111) plane sidewalls, the recess having a first predetermined depth less than the thickness of the wafer;

reapplying an etch resistant layer on the base surface to prevent further etching of the recess;

patterning the etch resistant layer on the upper surface to produce an upper etch opening having a predetermined location in alignment with the recess and predetermined dimensions with respect to the upper surface; and anisotropic etching the wafer to produce a trough corresponding to the upper etch opening in the upper surface and bounded by (111) sidewalls, the anisotropic etching of the trough continuing to a second predetermined depth to intersect the recess and form the buttable edge defined by the intersection of the (111) plane sidewalls of the recess and trough.

22. The method of claim 21 wherein the etch resistant layer is applied at a temperature in the range of 250° C. to 450° C.

23. The method of claim 22 wherein the etch resistant layers are applied at a temperature of about 350° C.

24. The method of claim 21 wherein the etch resistant layer is plasma silicon nitride.

25. A method of producing a buttable surface in a (100) silicon wafer by orientation dependent etching, the buttable surface being located between an upper surface of the wafer and an opposite base surface of the wafer, the method comprising the steps of:

applying an etch resistant layer on the upper and base surfaces of the wafer;

patterning the etch resistant layer on the upper surface to produce an upper etch opening having a location and dimensions which define the predetermined location and dimensions of the buttable surface;

patterning the etch resistant layer on the base surface to produce a lower etch opening aligned with the upper etch opening within a predetermined tolerance; and anisotropic etching the wafer to produce a first recess corresponding to the upper etch opening in the upper surface and a second recess corresponding to the lower etch opening in the base surface, each of the first and second recesses being bounded by (111) plane sidewalls, the anisotropic etching of the second recess intersecting the first recess to form the buttable surface bounded by (111) plane sidewalls and having its predetermined dimensions in a location defined by the patterning of the upper etch opening.

26. The method of claim 25 wherein the etch resistant layers are applied at a temperature between 250° C. and 450° C.

27. The method of claim 26 wherein the etch resistant layers are applied at about 350° C.

28. The method of claim 25 wherein the etch resistant layer is plasma silicon nitride.

29. A method of fabricating a pagewidth printhead for an ink jet printing device, by butting together (100) silicon wafer subunits having butting edges, the method comprising the steps of:

obtaining a (100) silicon wafer having an upper surface and an opposite base surface;

applying an etch resistant layer on the upper and base surfaces of the wafer;

patterning the etch resistant layer on the upper surface to produce a plurality of upper etch openings having locations and dimensions which define predetermined locations and dimensions of a plurality of butting surfaces;

patterning the etch resistant layer on the base surface to produce a plurality of lower etch openings each aligned with a corresponding upper etch opening within a predetermined tolerance;

anisotropic etching the wafer to produce a plurality of upper recesses corresponding to the upper etch openings in the upper surface and a plurality of lower recesses corresponding to the lower etch openings in the base surface, each of the upper and lower recesses being bounded by (111) plane sidewalls, the anisotropic etching of the lower recesses intersecting the upper recesses and forming a plurality of through holes;

separating the wafer along the through holes to form at least one wafer subunit, the (111) plane sidewalls of the through holes defining butting surfaces on opposite sides of the at least one subunit, the butting surfaces having their predetermined dimensions and location defined by the patterning of the upper etch opening; and aligning a series of subunits with their butting surfaces adjacent to and butting against one another to form an array with a length corresponding to a pagewidth.

30. The method of claim 29 wherein the etch resistant layers are applied at a temperature between 250° C. and 450° C.

31. The method of claim 30 wherein the etch resistant layers are applied at a temperature of about 350° C.

32. The method of claim 29 wherein the etch resistant layer is plasma silicon nitride.

33. The method of claim 29 wherein integrated circuitry is fabricated on the upper surface of the wafer prior to application of the etch resistant layers.

* * * * *